United States Patent [19]

Horowitz et al.

[11] 3,998,602

[45] Dec. 21, 1976

[54] METAL PLATING OF POLYMERIC SUBSTRATES

[76] Inventors: Carl Horowitz; Michael Dichter; Duryodhan Mangaraj, all of Polymer Research Corp. of America, 2186 Mill Ave., Brooklyn, N.Y. 11234

[22] Filed: Feb. 7, 1975

[21] Appl. No.: 548,091

[52] U.S. Cl. .................................. 29/195; 29/199; 427/306; 427/307; 427/333; 427/400; 428/461; 428/463

[51] Int. Cl.$^2$ ............................................ C23C 3/02

[58] Field of Search ............ 427/304, 306, 98, 399, 427/400, 333; 428/461, 463, 455, 500; 29/195, 199

[56] References Cited

UNITED STATES PATENTS

| | | | |
|---|---|---|---|
| 3,672,986 | 6/1972 | Schneble et al. | 427/98 X |
| 3,698,931 | 10/1972 | Horowitz | 427/399 |
| 3,801,478 | 4/1974 | Heger et al. | 427/322 X |
| 3,847,649 | 11/1974 | Sova | 427/428 |

*Primary Examiner*—Ralph S. Kendall
*Attorney, Agent, or Firm*—St.Onge Mayers Steward & Reens

[57] ABSTRACT

Methods are disclosed for the metallizing of non-metallic substrates, i.e. polymeric substrates, by the coating of the substrate with polymerizable monomers in the presence of a small amount of silver ion. The substrate is cleaned, acid etched and then contacted with a monomer solution containing a soluble silver salt. The monomers are preferably polyfunctional and form a polymerized layer grafted onto the polymer substrate. A peroxide is also disclosed in the monomer solution for regeneration of the silver ion concentration and to combine with monomers to produce homopolymers which also attach to the active sites on the substrate and to side chains of the graft polymer. The grafted layer contains silver atoms closely bound to it and the silver atoms form nucleating agents for the deposition of copper from an electroless plating bath. The metallized substrate may then be further electroplated.

21 Claims, No Drawings

METAL PLATING OF POLYMERIC SUBSTRATES

BACKGROUND OF THE INVENTION

This invention relates to the electroless plating of non-metallic substrates such as polymeric substrates and more particularly to the plating of such substrates by the grafting of one or more polymerizable monomers, and polymerizing such monomers, to form a coating on the substrate surface in the presence of silver ions. Copper is then deposited on the grafted layer from an electroless plating solution with silver atoms held in the interstices of the polymerized coating acting as nucleating agents for the deposition of metallic copper.

The electroless plating of polymeric substrates by the seeding of the substrate with a precious metal such as palladium is known. The palladium seeding process however, is expensive, since the use of palladium adds substantially to the cost. It is also known to use silver ions to generally initiate polymer grafting on a substrate. Such processes generally are disclosed in U.S. Pat. Nos. 3,698,931 (Horowitz), 3,801,478 (Heger et al), and 3,847,649 (Sova).

While the methods disclosed in the above prior art patents may provide an acceptable bonding of a metal film to a polymeric substrate, the processes in some cases are still excessively expensive, since they require a substantial amount of silver. Further, the bond that is formed between the metal layer and the polymeric substrate may be subject to attack by water or may be thermally decomposable. In such prior art processes the use of excess silver salt adds substantially to the cost of the process. Further, the use of excess silver salt tends to make the metal film much more sensitive to attack by water, since the plating is subject to attack by water and eventual weakening of the film bond, because of the salt layer underlying the plated film.

Accordingly, it is an object of the present invention to provide a process for the electroless plating of a non-metallic substrate such as a polymeric substrate with silver ion used as an initiator for grafting one or more unsaturated monomers onto the substrate and then electrolessly plating a metal onto the silver atoms held in the interstices of the grafted polymerized coating on the substrate.

SUMMARY OF THE INVENTION

The invention entails the process of the grafting of monomers onto the surface of a polymeric substrate which has been cleaned and etched with chromic or sulfuric acid or other appropriate etching solution. A very small amount of silver ion is used as the graft initiator. The monomers are further polymerized to form a tightly bound layer on the polymeric substrate. As a by-product of the grafting, silver atoms are formed in the process and are finely dispersed on the substrate coating. These silver atoms form nuclei for the deposition of copper from an electroless copper plating bath. The polymeric layer formed on the polymeric substrate is not necessarily electrically conductive since it may be somewhat discontinuous. The silver atoms bound in the polymer layer holds the subsequently deposited copper crystals to the polymeric substrate surface.

The amount of silver salt used is very small, e.g. 0.001 to 1.0% by weight of the monomeric solution and preferably about 0.05 to 0.1% by weight. The monomers used may be vinyl monomers or other ethylinically unsaturated acids, or they can also be unsaturated esters, nitrides and the like, used alone or in combination with unsaturated acids.

The use of the silver ion as a graft initiator substantially reduces the amount of silver salt required for the process. Further, the silver ion is regenerated by an oxidizing agent, such as a peroxide, so that the polymerization step is autocatalytic. The use of very minor amounts of soluble silver salts for graft initiation eliminates the problems of salt under the deposited copper. Accordingly, the metallic plating is strongly bonded to the substrate, with no decomposable salt layer beneath the copper plating. The copper is deposited as crystals from an electroless plating bath and forms around silver atoms tightly held in the polymerized layer. Once the substrate is plated with copper, other metal such as nickel, chromium and the like can be deposited either by electroless or electroplating methods. The process may be effected by spraying, dipping, roller coating, silk screening or other known coating methods.

The layer of polymer and the copper plate do not alter the mechanical properties of the substrate since the total deposited material is only a few microns in thickness. The process is economical because a very small amount of silver salt is required as a graft initiator and only a small amount of silver remains on the polymer layer as nucleation sites. The process does not require a high concentration of monomer and requires only a few steps in practice.

DETAILED DESCRIPTION OF THE INVENTION

In accordance with the method of the present invention, the polymeric substrate is metallized by the formation of a graft polymer coating on the substrate with the grafting and polymerization of the coating being initiated by a very small amount of silver ion. The grafting and polymerization of the coating takes place in the presence of a peroxide so that silver ion is regenerated and the reaction is autocatalytic. Metallic silver as well as silver ions are held by ionic or polar interaction with the functional groups of the grafted chains. The monomers have more than one functional group or two or more monomers are used to provide the graft polymer layer. In the reaction the silver atoms also are catalysts for the decomposition of peroxides present and the added free radicals thus form and initiate the growth of homopolymer radicals. The graft polymer radicals and the homopolymer radicals combine to form the polymerized coating which is grafted to the substrate.

The substrate is first cleaned of grease and dirt, rinsed with water and then etched with chromic or sulfuric acid or other suitable etching solution to prepare the polymeric substrate for the polymer grafting. After a water rinse, the polyfunctional monomer (or combination of monomers) is then grafted to the substrate with the silver ion as a graft initiator. A small amount of very fine metallic silver is held by the polymerized coating and the silver provides nucleation sites for the electroless deposition of metal onto the polymerized coating.

It is not necessary to have electrical continuity between the silver atoms on the polymerized layer and accordingly, the amount of silver used is substantially less than would be required for electrolytic plating.

When the grafted polymerized surface coating is immersed in electroless copper solution, $Cu^{++}$ is reduced to metallic copper by the electroless copper solution which contains formaldehyde or other reducing agents. The reduction is nucleated by the metallic silver atoms which are present and tightly bound in the interstices of the grafted chains of the polymeric coating. The metallic copper nucleated on the silver atoms further autocatalyzes the reduction of copper ions from the electroless copper solution and thus metallizes the plastic substrate. Since the metallic copper is deposited in the form of crystals around the silver atoms and the silver atoms are held ionically or by polar interaction with the grafted chains of the coating, the metallic surface which is formed on the coating is bound strongly to the plastic substrate. The adhesion of the metallized coating compares favorably with a metallic bond.

The process is believed to occur in accordance with the following equations:

of an exemplary vinyl monomer to the substrate R at the oxidized site to form a graft polymer radical on the substrate. Reaction 3 illustrates the regeneration of silver ion by the presence of peroxide in the monomer solution. Reaction 4 shows the formation of a homopolymer radical, a reaction of vinyl monomer with the peroxide radical. Reaction 5 illustrates the combination of the substrate with its grafted polymer radical combining with the peroxide homopolymer radical to form a grafted polymerized coating on the substrate. Reaction 6 illustrates the metallic silver combining with the graft polymer layer. The silver atoms are held by the side groups of the grafted layer.

Reactions Nos. 7 and 8 illustrate deposition of copper ions from an electroless formaldehyde solution to be deposited as copper metal on the metallic silver

Polymeric Substrate

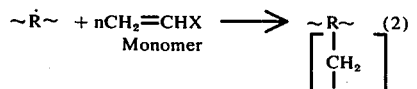

Graft polymer radical.

$R_1OOH + Ag \longrightarrow R_1\dot{O} + OH^- + Ag^+$ (3)
Peroxide                  Regeneration of silver ion.

Homopolymer radical.

Graft polymer.

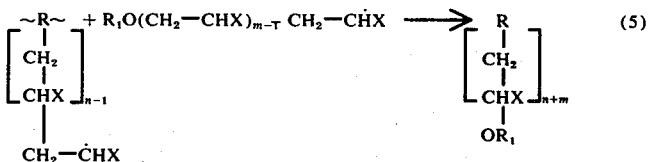

Silver atoms are held by the side groups of the grafted polymer.

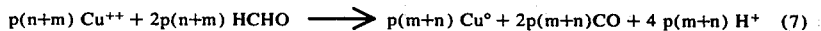

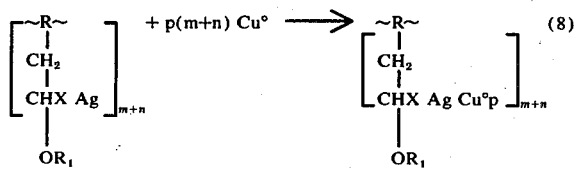

Copper crystals formed around silver atoms are held strongly in the interstices of grafted coating.

Reaction 1 provides a radical site on the polymeric substrate by the reduction of silver ion and the oxidation of the substrate. Reaction 2 illustrates the grafting (Reaction No. 8). The metallic silver is tightly bound to the grafted coating on the substrate and initiates and nucleates the deposition of copper crystals around the silver atoms to hold the copper to the grafted coating.

The polymeric substrates which may be metallized in accordance with the process of the invention include, but are not necessarily limited to, a number of articles, fibers and sheets, made of polymers and copolymers of styrene, butadiene, acrylonitrile, phenylene oxide and its derivatives, ethylene, propylene, polyurethane and the like.

The polymerizable monomers which may be used alone or in mixtures of two or more are as follows: acrylic acid, cyanoethyl acrylate, dimethyl methacrylate, hydroxy propyl acrylate, 2-cyanoethyl acrylate, vinylidene chloride, chloroprene, isoprene, styrene, 1.3-butylene dimethacrylate, cetyl vinyl ether, isooctylvinyl ether, acrylonitrile, acrylamide, N-vinyl pyridine, glycidyl methacrylate, N-vinyl caprolactam, N-vinyl pyrrolidone, N-vinyl carbazole, methacrylic acid, ethyl acrylate, ethyl methacrylate, itaconic acid, isobutyl methacrylate, methyl acrylate, sodium styrene sulfonate, sodium vinyl sulfonate, bis(beta-chloroethyl) vinyl phosphonate, divinylether of ethylene glycol, divinyl ether of butanediol, vinyl toluene, vinyl acetate, octadecyl vinyl ether, mono, di-, tetra- and poly-ethylene glycoldimethacrylate, methylvinyl pyridine, allylacrylate and methacrylate, allylchloride, allyalcohol, perfluoro alkyl acrylates and methacrylates, p-aminostyrene, vinyl bromide and vinylidene bromide, trimethyl vinylbenzylammonium chloride, vinyltrifluoroacetate (followed by hydrolysis to poly-vinyl alcohol), diallyl chloromethyl phosphonate, diallyl benzene phosphonate, diallyl dimethyl ammonium chloride, maleic anhydride, diallyl diethyl ammonium bromide, glycidyl acrylate and methacrylate, ethylene glycol, diethyleneglycol-and polyethyleneglycol acrylates and methacrylates, vinyl perfluoro octanoate.

The silver ion as an initiator may be supplied by any soluble silver salt including but not limited to silver nitrate, silver acetate and silver sulfate. In organic solvents silver perchlorate may be used since it is soluble in organic solvents. The concentration of the silver salt should be from 0.001% to 1.0% by weight of monomer solution, with the lower concentrations preferred for reasons of economy. The monomer or monomers in the solution can vary widely, for example, up to 50% of the solution. A preferred concentration monomer would be between 1 to 20% by weight of the total monomer solution.

As oxidizing agents for the regeneration of silver ion in the monomer solution, the following can be used: acetyl peroxide, methyl ethyl ketone peroxides, ammonium persulfate, hydrogen peroxide, tert-butylhydroperoxide, ditert-butyl peroxide, benzoyl peroxide, dicumyl peroxide, lauroyl peroxide, tert-butyl perbenzoate and peracetic acid.

Any suitable solvent for the monomer solution may be used such as water, methyl, ethyl or isopropyl alcohol, methylene chloride, tetrahydrofuran, dimethyl-formamide, tetrahydrofurfuryl alcohol, dimethylsulfoxide, methyl ethyl ketone, ethyl acetate. Mixtures of two or more of such solvents may also be used.

The etching of the polymeric substrate may also be accomplished by a mixture of sulfuric acid and sulfur trioxide as set forth in Examples 3 and 4 below.

The process of plating polymeric substrates in accordance with the invention is as follows. First, the polymeric articles to be plated are cleaned and degreased and rinsed with water. It is then acid etched, preferably with chromic or sulfuric acid (with or without sulfur trioxide) to prepare the substrate surface for the graft polymerization. After the acid etching, the surface is again thoroughly rinsed with water and the polymeric substrate surface is then ready for the polymer grafting step. The substrate surface is contacted with a grafting solution containing one or more monomers having more than one functional group and an initiator system having a small but effective amount of silver ion. Because the silver ion is used as an initiator only, about from 0.001 to less than 1.0% of a silver salt by weight of monomer solution is all that is required. From 0.05 to 0.1% silver salt by weight of monomer solution is preferred for reasons of economy and better results. The monomer solution also preferably contains an oxidizing agent such as a peroxide to regenerate the silver ion and to form further homopolymers for grafting to the substrate and/or to side chains of the graft polymer. The graft polymer solution may be applied to the substrate by spraying, dipping, roller coating, silk screening, or any other known coating method. It has been found that dipping is particularly effective.

After contact with the grafting solution the polymerized grafted layer is then cured for from 10 to 60 minutes at a temperature of from 25° C to 100° C. After curing, the polymeric substrate has a grafted polymerized layer chemically bonded thereto and has finely divided metallic silver bound in the interstices of the graft polymer layer. The article to be metallized is then contacted with an electroless copper plating solution and the copper nucleates on the metallic silver to provide a thin continuous layer of copper which is bound to the silver atoms, which are in turn secured to the substrate by the polymeric layer. Thereafter, the copper layer may be electrolessly or electrolytically plated with nickel, chrome or the like, as is known in the art.

The amount of silver required is substantially less than that which is required for providing an electrically conducting layer of silver on the grafted polymerized layer. Accordingly, the method of the invention is economical in practice and provides excellent bonding of the copper to the article to be metallized.

In the following examples a number of polymeric articles were plated in accordance with the invention and in each case the samples were cleaned and rinsed with water, then etched and again rinsed with water for contacting with the monomer solution set forth in the examples. The metallized coating was then tested for adhesion after thermal cycling with the transparent tape peel test. The testing comprised the thermal cycling of each sample to 180° F for 30 minutes, then the samples were cooled to room temperature and subjected to −60° F temperature for 30 additional minutes. The samples were then brought back to room temperature and tested for adhesion by cutting through the metallized layer with a sharp instrument. In about a ½ inch square 5 parallel scratches were made in one direction and 5 additional parallel scratches across the first group of scratches. Scotch brand transparent tape was then applied over the scratched area and firmly pressed onto the metallized article. The tape was then peeled to see if any of the small squares (approximately 1/10th of an inch on a side) were peeled off by the pull of the tape as it was removed.

In the following examples the polymeric samples to be tested were made of a copolymer of acrylonitrile-butadiene-styrene (ABS) and other samples were made of polyphenylene oxide sold under the brand name "Noryl" by the General Electric Company. The following examples are illustrative of the invention and are not intended to be limiting.

The following examples are illustrative of the invention, and are not intended to be limiting.

EXAMPLE 1

| | |
|---|---|
| Acrylic acid | 2.0 gms. |
| Silver Nitrate | 0.2 gms. |
| Water | 1.0 gms. |
| Isopropanol | 50.0 gms. |
| Methylene chloride | 40.0 gms. |
| Formaldehyde | 5.0 gms. |
| Silane A187 (Union Carbide) | 0.2 gms. |
| Acetyl peroxide | 0.5 gms. |

The ABS and Noryl samples were cleaned, rinsed and then etched with chromic acid and rinsed with water until free from acid. They were then dipped in the above graft monomer solution for 2 minutes, cured at 160° F for half an hour, cooled and then dipped in electroless copper solution to produce the copper flash. Subsequently the samples were electroplated with mat nickel, bright nickel and chrome. The adhesion of the metal on the plastic substrate withstood the transparent tape peel test after substantial thermal cycling, as described above.

EXAMPLE 2

| | |
|---|---|
| Cynoethyl Acrylate | 1.0 gms. |
| Acryloamido propane sulphonic acid (Amps) | 1.0 gms. |
| Silver Nitrate | 0.1 gms. |
| Water | 2.0 gms. |
| Methyl ethyl ketone peroxide | 0.2 gms. |
| Silane A187 | 0.2 gms. |
| Isopropanol | 60.0 gms. |
| Methylene chloride | 30.0 gms. |

The solution was warmed at 65° for half an hour. ABS and Noryl samples were treated, cured and plated in the same way as in Example 1 above. Adhesion and resistance to thermal cycling was found to be excellent.

EXAMPLE 3

| | |
|---|---|
| Dimethyl aminoethyl methacrylate | 1.0 gms. |
| Silver nitrate | 0.1 gms. |
| Ammonium hydroxide (26%) | 2. gms. |
| Isopropanol | 60.0 gms. |
| Methylene chloride | 30.0 gms. |
| Acetyl peroxide | 0.2 gms. |
| Silane A187 | 0.2 gms. |

The pH of the monomer solution was adjusted to 10.5. The ABS and Noryl samples were prepared as in Example 1, except that they were etched with one part concentrated sulfuric acid and four parts oleum (sulfur trioxide in concentrated sulfuric acid) for 40 seconds and then washed thoroughly with water. Subsequently the samples were dried at 190° F for 10 minutes and then treated with the above monomer solution for 2 minutes and cured at 180° F for 35 minutes. The cured samples were cooled to room temperature and then dipped in an autocatalytic copper bath for 15 minutes at which time a uniform layer of copper was deposited. Subsequently the sample was electroplated with nickel for 30 minutes. The metallic layer had good adhesion to the substrate.

EXAMPLE 4

| | |
|---|---|
| Hydroxy propyl acrylate | 2.0 gms. |
| Dimethyl aminoethyl acrylate | 1.0 gms. |
| Silver nitrate | 0.1 gms. |
| Isopropanol | 60.0 gms. |
| Silane A187 | 0.2 gms. |
| Methylene chloride | 30.0 gms. |
| Acetyl peroxide | 0.3 gms. |

The ABS and Noryl samples were pretreated in the same way as in Example 3 and treated with the above monomer solution for 2 minutes and cured at 170° F for 20 minutes. The cured samples were cooled to room temperature, then dipped into an autocatalytic copper bath for 11 minutes at 77° F followed by electroplating with nickel for 30 minutes. The nickel layer did not blister nor peel off and had fair adhesion to the substrate.

EXAMPLE 5

| | |
|---|---|
| 2-Cyanoethyl acrylate | 1.0 gms. |
| Silver nitrate | 0.2 gms. |
| Acetyl peroxide | 0.1 gms. |
| Silane A187 | 0.1 gms. |
| Isopropanol | 60.0 gms. |
| Methylene chloride | 30.0 gms. |
| Water | 1.0 gms. |

The ABS and Noryl samples were treated with chromic acid solution for 3 minutes, rinsed and deionized water and dried at 160° – 170° F for 1 to 2 minutes. The cooled samples were treated in the above monomer solution for 2 minutes and subsequently cured at 180° F for 30 minutes. The cured samples were dipped in an autocatalytic copper bath for 12 minutes followed by nickel plating for more than 90 minutes. No peeling off and no blistering of the nickel layer and passing of the transparent tape peel off test showing good adhesion of the metal to the plastic plates.

In the above examples, Silane A187 is a glycidoxypropyl trimethoxysilane (sold by Union Carbide) and functions as an additional chemical bonding agent for copper to the substrate.

While the above examples illustrate the grafting of specific monomers onto a polymeric substrate, it should be understood that certain modifications and changes can be made in the process without departing from the spirit and scope of the invention.

What is claimed is:

1. The method of electrolessly plating a polymeric substrate comprising the steps of
   A. acid etching said polymeric substrate;
   B. grafting one or more polymerizable monomers from a monomeric solution to the surface of said etched polymeric substrate
      1. and polymerizing said monomers to form a polymerized layer on said substrate,
      2. by initiating said grafting in the presence of a small but effective amount of a soluble silver salt and to intersperse metallic silver in the polymerized layer as it is formed;
   C. curing said polymerized layer; and then
   D. contacting said grafted polymerized layer with an electroless metal plating bath whereby the metal from said electroless plating bath is deposited on silver atoms physically bound by the interstices of said polymerized layer.

2. The method of electrolessly plating a polymeric substrate defined in claim 1 wherein a major portion of said monomers are substantially in the form of a free acid in solution.

3. The method of electrolessly plating a polymeric substrate defined in claim 2 wherein said free acid is acrylic acid.

4. The method of electrolessly plating a polymeric substrate defined in claim 1 wherein said silver salt comprises from 0.001 to less than 1.0% by weight of said monomer solution.

5. The method of electrolessly plating a polymeric substrate defined in claim 1 wherein the metal of said electroless metal plating solution is taken from the group consisting of copper and nickel.

6. The method of electrolessly plating a polymeric substrate defined in claim 1 wherein said monomers are in a solution containing an oxidizing agent for regeneration of silver ion in said monomer solution.

7. The method of electrolessly plating a polymeric substrate defined in claim 6 wherein said oxidizing agent is taken from the group consisting of acetyl peroxide, methyl ethyl ketone peroxide, ammonium persulfate, hydrogen peroxide, tert-butylhydroperoxide, di-tertbutylperoxide, benzoyl peroxide, dicumyl peroxide, lauroyl peroxide, tert-butyl perbenzoate and peracetic acid.

8. The method of electrolessly plating a polymeric substrate defined in claim 1 wherein said silver ion is present in the monomer solution by disassociation of a silver salt taken from the group consisting of silver nitrate, silver acetate, silver sulfate, and silver perchlorate.

9. The method of electrolessly plating a polymeric substrate as defined in claim 1 wherein said monomers are taken from the group consisting of acrylic acid, cyanoethyl acrylate, dimethyl aminoethyl methacrylate, hydroxy propyl acrylate, 2-cyanoethyl acrylate, vinylidene chloride, chloroprene, isoprene, styrene, 1.3-butylene dimethacrylate, cetyl vinyl ether, isooctylvinyl ether, acrylonitrile, acrylamide, N-vinyl pyridine, glycidyl methacrylate, N-vinyl caprolactam, N-vinyl pyrrolidone, N-vinyl carbazole, methacrylic acid, ethyl acrylate, ethyl methacrylate, itaconic acid, isobutyl methacrylate, methyl acrylate, sodium styrene sulfonate, sodium vinyl sulfonate, bis(beta-chloroethyl) vinyl phosphonate, divinylether of ethylene glycol, divinyl ether of butanediol, vinyl toluene, vinyl acetate, octadecyl vinyl ether, mono, di-, tri-, tetra- and poly-ethylene glycoldimethacrylate, methylvinyl pyridine, allylacrylate and methacrylate, allylchloride, allylalcohol, perfluoro alkyl acrylates and methacrylates, p-amino-styrene, vinyl bromide and vinylidene bromide, trimethyl vinylbenzyammonium chloride, vinyltrifluoroacetate (followed by hydrolysis to poly-vinyl alcohol), diallyl chloromethyl phosphonate, diallyl benzene phosphonate, diallyl dimethyl ammonium chloride, maleic anhydride, diallyl diethyl ammonium bromide, glycidyl acrylate and methacrylate, ethylene glycol, diethyleneglycol-and polyethyleneglycol acrylates and methacrylates, vinyl perfluoro octanoate.

10. The method of electrolessly plating a polymeric substrate defined in claim 1 wherein said acid etching is performed by contacting said polymeric substrate with an acid taken from the group consisting of chromic acid and sulfuric acid.

11. The method of electrolessly plating a polymeric substrate comprising the steps of:
A. acid etching the polymeric substrate;
B. contacting said etched polymeric substrate with a solution of one or more unsaturated monomers,
 1. in the presence of a silver ion initiator,
  a. said initiator being present as a silver salt making up from 0.001% to less than 1.0% by weight of said monomer solution to form graft polymer radicals,
  b. the amount of silver salt being an amount effective to provide metallic silver nucleating sites interspersed in said graft polymer radicals,
 2. regenerating silver ions which have been reduced to metallic silver by the presence of an oxidizing agent in said monomer solution,
whereby said monomer is grafted to said substrate and is polymerized to form a layer thereon;
C. during said polymerized layer; and then
D. contacting said polymerized coating with an electroless plating bath comprising metal ions in a reducing medium,
whereby metallic crystals from said electroless plating bath are deposited around silver atoms held in the interstices of said grafted polymerized layer on said substrate.

12. The method of electrolessly plating a polymeric substrate as defined in claim 11 wherein said unsaturated monomers are taken from the group consisting of acrylic acid, cyanoethyl acrylate, dimethyl aminoethyl methacrylate, hydroxy propyl acrylate, 2-cyanoethyl acrylate, vinylidene chloride, chloroprene, isoprene, styrene, 1.3-butylene dimethacrylate, cetyl vinyl ether, isooctylvinyl ether, acrylonitrile, acrylamide, N-vinyl pyridine, glycidyl methacrylate, N-vinyl caprolactam, N-vinyl pyrrolidone, N-vinyl carbazole, methacrylic acid, ethyl acrylate, ethyl methacrylate, itaconic acid, isobutyl methacrylate, methyl acrylate, sodium styrene sulfonate, sodium vinyl sulfonate, bis(beta-chloroethyl) vinyl phosphonate, divinylether of ethylene glycol, divinyl ether of butanediol, vinyl toluene, vinyl acetate, octadecyl vinyl ether, mono, di-, tri-, tetra- and poly-ethylene glycoldimethacrylate, methylvinyl pyridine, allylacrylate and methacrylate, allylchloride, allylalcohol, perfluoro alkyl acrylates and methacrylates, p-amino-styrene, vinyl bromide and vinylidene bromide, trimethyl vinylbenzyammonium chloride, vinyltrifluoroacetate (followed by hydrolysis to poly-vinyl alcohol), diallyl chloromethyl phosphonate, diallyl benzene phosphonate, diallyl dimethyl ammonium chloride, maleic anhydride, diallyl diethyl ammonium bromide, glycidyl acrylate and methacrylate, ethylene glycol, diethyleneglycol- and polyethyleneglycol acrylates and methacrylates, vinyl perfluoro octanoate.

13. The method of electrolessly plating a polymeric substrate as defined in claim 11 wherein the metal ions in said electroless plating bath are taken from the group consisting of copper and nickel.

14. The method of electrolessly plating a polymeric substrate as defined in claim 11 wherein said oxidizing agent is a peroxide of the general formula ROOR' and wherein the RO radical of said peroxide is combined with at least one of said monomers to form a homopolymer radical which then attaches to an active site as part of said polymeric substrate coating.

15. The method of electrolessly plating a polymeric substrate as defined in claim 11 wherein said oxidizing agent is taken from the group consisting of acetyl peroxide, methyl ethyl ketone peroxide, ammonium persulfate, hydrogen peroxide, tert-butylhydroperoxide, di-tertbutylperoxide, benzoyl peroxide, dicumyl peroxide, lauroyl peroxide, tert-butyl perbenzoate and peracetic acid.

16. The method of electrolessly plating a polymeric substrate comprising the steps of:
   A. cleaning said substrate;
   B. rinsing said substrate with water;
   C. acid etching said substrate
      1. with an acid taken from the group consisting of chromic acid and sulfuric acid;
   D. rinsing said acid from said substrate with water;
   E. contacting said etched substrate with a monomeric solution containing a small but effective amount of silver ion as a graft initiator, to form a graft polymer layer on said substrate
      1. having metallic silver finely distributed in and held by said graft polymer layer;
   F. curing said graft polymer layer; and then
   G. electrolessly plating copper onto said graft polymer layer from an electroless plating solution.

17. The method of electrolessly plating a polymeric substrate as defined in claim 16 wherein said silver is present in said monomer solution as a soluble silver salt comprising from 0.05 to 0.1% of said monomer solution by weight.

18. The method of electrolessly plating a polymeric substrate as defined in claim 16 wherein there is present in said monomer solution an oxidizing agent for regeneration of silver ions.

19. The method of electrolessly plating a polymeric substrate as defined in claim 18 wherein said oxidizing agent is a peroxide of the general formula ROOH wherein the RO radical combines with said monomer to form a homopolymer radical which is polymerized in said graft polymer layer.

20. An electrolessly plated article, comprising:
   A. a polymeric substrate;
   B. a polymerized layer grafted onto the surface of said substrate;
   C. metallic silver finely distributed in and held by said polymerized layer; and
   D. a metallic copper layer deposited on and bound to said metallic silver.

21. The article defined in claim 20 wherein there is a further layer of nickel deposited over said copper layer.

* * * * *

UNITED STATES PATENT OFFICE
CERTIFICATE OF CORRECTION

PATENT NO. : 3,998,602
DATED : December 21, 1976
INVENTOR(S) : Carl Horowitz; Michael Dichter; Duryodhan Mangaraj It is certified that error appears in the above-identified patent and that said Letters Patent are hereby corrected as shown below:

Column 5, line 22, insert --tri,-- between "di-," and "tetra-";
Column 5, line 27, "vinylbenzylammonium" should be --vinylbenzyammonium--.
Column 8, line 32, "and" between "rinsed" and "deionized" should be --with--.
Column 10, line 19, "during" should be --curing--.

Signed and Sealed this

Eighth Day of March 1977

[SEAL]

Attest:

RUTH C. MASON
Attesting Officer

C. MARSHALL DANN
Commissioner of Patents and Trademarks